United States Patent

Aoki

(10) Patent No.: US 6,674,015 B2
(45) Date of Patent: Jan. 6, 2004

(54) MULTI-LAYER INTERCONNECTION BOARD

(75) Inventor: Shinji Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 10/096,647

(22) Filed: Mar. 14, 2002

(65) Prior Publication Data

US 2003/0051902 A1 Mar. 20, 2003

(30) Foreign Application Priority Data

Sep. 18, 2001 (JP) ........................................ 2001-283801

(51) Int. Cl.[7] .................................................. H05K 1/03
(52) U.S. Cl. ........................ 174/255; 174/265; 174/267
(58) Field of Search ................................. 174/255–266; 361/760, 761, 777–783

(56) References Cited

U.S. PATENT DOCUMENTS 3,739,469 A * 6/1973 Dougherty, Jr. ............... 29/852
4,560,962 A * 12/1985 Barrow .......................... 333/1
5,381,306 A * 1/1995 Schumacher et al. ....... 361/792
5,639,989 A * 6/1997 Higgins, III ........... 174/35 MS
5,783,865 A * 7/1998 Higashiguchi et al. ...... 257/774

FOREIGN PATENT DOCUMENTS

| JP | 4-37086 | 2/1992 | |
| JP | 4-133394 | 5/1992 | |
| JP | 07273488 A | * 10/1995 | .......... H05K/09/00 |
| JP | 10-41677 | 2/1998 | |
| JP | 2000261150 A | * 9/2000 | .......... H05K/03/46 |

* cited by examiner

*Primary Examiner*—Kamand Cuneo
*Assistant Examiner*—Tuan Dinh
(74) *Attorney, Agent, or Firm*—Armstrong, Westerman & Hattori, LLP

(57) ABSTRACT

A multi-layer interconnection board, includes a multi-layer structure in which plural interconnections are provided and which includes a ground layer, and a hole part provided in the multi-layer structure. A conductive part is provided on an internal wall part of the hole part.

7 Claims, 5 Drawing Sheets

MULTI-LAYER INTERCONNECTION BOARD

BACKGROUND OF THE INVENTION

1. Field of the Invention

The present invention generally relates to multi-layer interconnection boards, and more particularly, to a multi-layer interconnection board on which an electronic device such as a switch or connector is packaged.

2. Description of the Related Art

A multi-layer interconnection board having a multi layer structure is used as an interconnection board built in a personal computer (PC) for example, based on an improvement of packaging density of electronic devices on the multi-layer interconnection board. The various electronic devices such as a semiconductor device, chip parts, a switch, or a connector are packaged on the multi-layer interconnection board. Since the PC is miniaturized and made thin, the packaging density of the electronic devices has a tendency to be high.

In addition, since the electronic device such as the semiconductor device is apt to be influenced by a disturbance, the PC has various mechanisms preventing noise caused by the disturbance from occurring. Accordingly, it is necessary to take measures for the prevention of the generation of noise for the multi-layer interconnection board, too.

FIG. 1 is a plan view of a related art multi-layer interconnection board. FIG. 2 is a cross sectional view taken on line A1—A1 in FIG. 1. FIG. 3 is a cross sectional view taken on line B1—B1 in FIG. 1.

A multi-layer interconnection board 1 shown in FIGS. 1 through 3 is provided in a portable PC.

As described above, a chip device such as the semiconductor device or a resister or an electronic device such as a switch or a connector is packaged on the multi-layer interconnection board 1 provided in the portable PC. Furthermore, since the portable PC in which the multi-layer interconnection board is built is miniaturized and made thin, the packaging density of the electronic devices on the multi-layer interconnection board 1 has a tendency to be high.

Accordingly, when the number of the electronic devices packaged on the multi-layer interconnection board and the packaging density of the electronic devices on the multi-layer interconnection board increase, it is difficult to provide sufficient interconnections in a case that only interconnections formed on a surface of the interconnection board are used. Hence, a width of each interconnection becomes narrow so that a resister value (an impedance) increases. Accordingly, the multi-layer interconnection board 1 in which plural internal layer interconnections are formed is used as a board for packaging the electronic devices.

In addition, some of the various electronic devices are required to have a high accuracy of positioning on the multi-layer interconnection board 1. For instance, the electronic device such as a connector or a switch is required to have a relatively high accuracy of positioning because a knob operation is implemented or a plug is connected/disconnected.

In order to package the electronic device of which a high accuracy of positioning on the multi-layer interconnection board 1 is required, a convex part for positioning is formed on the electronic device and a hole part 5 in which the convex part is inserted is formed in the multi-layer interconnection board 1. In addition, the electronic device is positioned and packaged at a designated position by inserting the convex part of the electronic device in the hole part 5.

Referring to FIG. 2, an internal layer interconnection formed on the multi-layer interconnection board 1 includes a ground layer (ground interconnection). The ground layer includes an internal ground layer 3 and a surface ground layer 4. The internal ground layer 3 is formed inside of a board body part 2. The surface ground layer 4 is formed on a surface of the board body part 2. The internal ground layer 3 and the surface ground layer 4 are electrically connected by a via hole part 6.

The internal ground layer 3 and the surface ground layer 4 have a structure in which the ground layers 3 and 4 have ground electric potentials by an earth connection. Accordingly, the ground layers 3 and 4 perform noise reduction functions, so that a noise, caused by an outside electromagnetic field, namely a disturbance, can be prevented from occurring.

In addition, it is well known that a high effect of noise reduction can be obtained as the ground layers 3 and 4 have large areas or low resister values (impedance). Accordingly, the internal ground layer 3 and the surface ground layer 4 are connected electrically in the related art.

However, according to the related art, the via hole part 6 is used for connecting the internal ground layer 3 formed inside of the board body part 2 to the surface ground layer 4 formed on the surface of the board body part 2. The via hole part 6 is a general means for connecting a layer to a layer.

The via hole part 6 includes a conductive film. For example, the conductive film is formed on an inside of the via hole part 6 having a diameter of 0.35 mm. The conductive film has a high electric resister value. Hence, in the related art, it may be impossible to connect the internal ground layer 3 and the surface ground layer 4 by a resister having a low resister value, and thereby it may be impossible to obtain a sufficiently large noise reduction effect.

Referring back to FIG. 1, a large number of the via hole parts 6 are formed in the board body part 2 in order to electrically connect the internal ground layer 3 to the surface ground layer 4. In an example shown in FIG. 1, eight of the via hole parts 6 are formed in the board body part 2. Another proposed related art has a structure in which the ground layers 3 and 4 are connected by a large number of the via hole parts so that the ground layers 3 and 4 are connected by a resister having a low resister value.

However, in a case that a large number of the via hole parts 6 are formed in the board body part 2, it may not be possible to form a signal interconnection at a via forming position where the ground layers 3 and 4 are connected. Accordingly, there are restrictions with regard to a position of a signal interconnection. Furthermore, in a case that a large number of the via hole parts 6 are formed in the board body part 2, the via hole parts 6 have a large forming area so that there is a limitation with regard to the positioning of the electronic device. In addition, in a case wherein a large number of the via hole parts 6 are formed in the board body part 2, the manufacturing process of the multi-layer interconnection board 1 is complicated since it is necessary to form a large number of the via hole parts 6. As a result, cost of the manufacturing process of the multi-layer interconnection board 1 may increase.

SUMMARY OF THE INVENTION

Accordingly, it is a general object of the present invention to provide a novel and useful multi-layer interconnection board having a simple structure and contributing to an improvement of noise reduction.

Another and more specific object of the present invention is to provide a multi-layer interconnection board, including a multi-layer structure in which plural interconnections are provided and which includes a ground layer, and a hole part provided in the multi-layer structure, wherein a conductive part is provided on an internal wall part of the hole part.

According to the present invention described above, it is possible to electrically connect the ground layers by the conductive part provided on the internal wall part of the hole part. Hence, the ground layers can be connected by a resister having a low resister value (low impedance). A significant reduction of noise caused by a disturbance can be obtained, as the ground layers have low resister values. Accordingly, it is possible to improve the effect of the noise reduction by connecting the ground layers with the conductive material provided on the internal wall part of the hole part.

The hole part may have a diameter so that a convex part of devices that can be packaged on the multi-layer interconnection board can be inserted in the hole, and thereby the devices can be positioned on the multi-layer interconnection board.

In the related art, if the ground layers are connected with the via hole part so that a resister value in the ground layers is made low, it is necessary to provide a large number of the via hole parts. As a result, the manufacturing process becomes complicated and the devices packaged on the multi-layer interconnection board are limited as to being positioned by the via hole parts.

On the other hand, in the present invention described above, the hole part in which the convex part of the devices packaged on the multi-layer interconnection board is inserted is used to connect the ground layers. In the present invention described above, the conductive part is provided on the internal wall part of the hole part and the ground layers are connected by the conductive part. As a result, it is possible to improve the effect of noise reduction without a complicated manufacturing process of the multi-layer interconnection board and a limitation on the positioning of the devices packaged on the multi-layer interconnection board.

The conductive part may be formed by a plating method.

According to the present invention described above, it is possible to form the conductive part on the internal wall part of the hole part accurately and easily. In addition, the thickness of the conductive part, namely an electric resister value, can be set freely by controlling the plating time.

The ground layer may include a surface ground layer provided on a surface part of the multi-layer interconnection board and an internal ground layer provided inside of the multi-layer interconnection board.

According to the present invention described above, not only the internal ground layer but also the surface ground layer is electrically connected with the conductive part provided on the internal wall part of the hole part. As a result, the surface ground layer and the internal ground layer are connected by a resister having a low resister value. Hence, it is possible to reduce noise significantly.

The hole part may be provided in a forming area of the surface ground layer.

According to the present invention described above, it is possible to form the conductive part and the surface ground layer in a body. As a result, it is possible to simplify the manufacturing process of the multi-layer interconnection board. In addition, since the conductive part and the surface ground layer are formed in a body, it is possible to make a resister of a connecting position of the conductive material and the surface ground layer of low resistance.

Other objects, features, and advantages of the present invention will become more apparent from the following detailed description when read in conjunction with the accompanying drawings.

DETAILED DESCRIPTION OF THE PREFERED EMBODIMENTS

A description will now be given, with reference to the drawings of FIGS. 4 through 7, of embodiments of the present invention.

Figure 1:
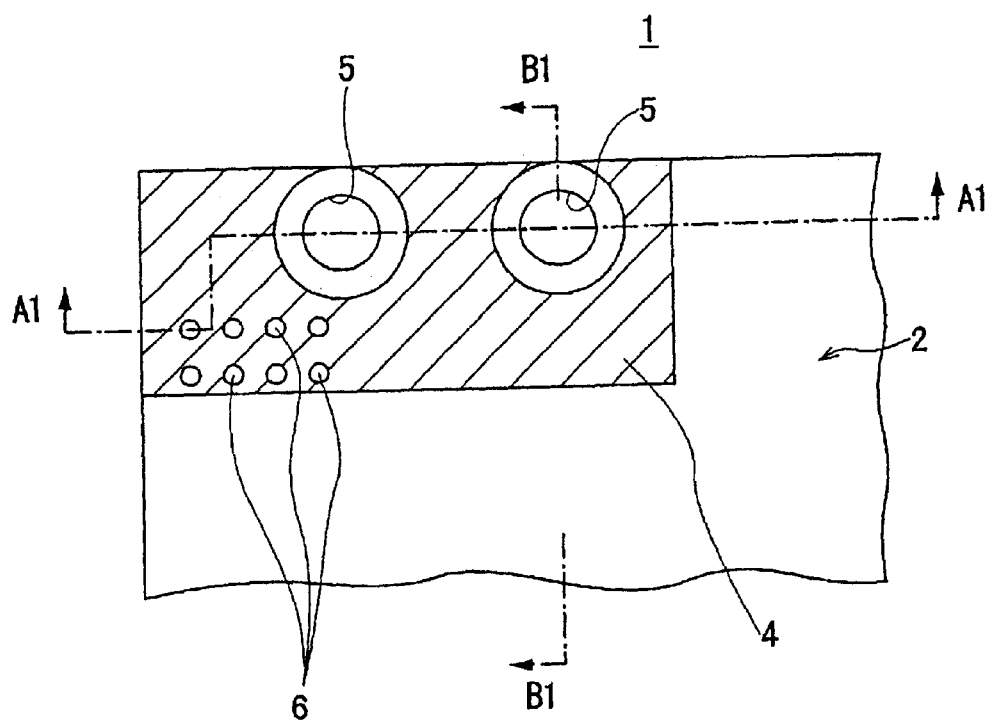
FIG. 1 is a plan view of a related art multi-layer interconnection board.
Figure 2:
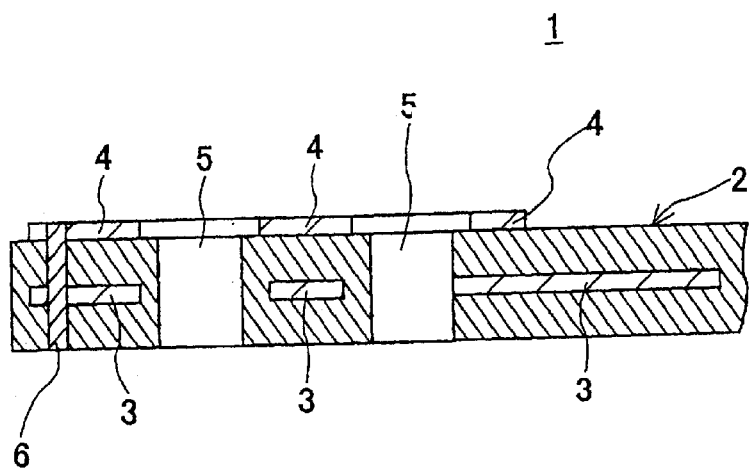
FIG. 2 is a cross sectional view taken on line A1—A1 in FIG. 1.
Figure 3:
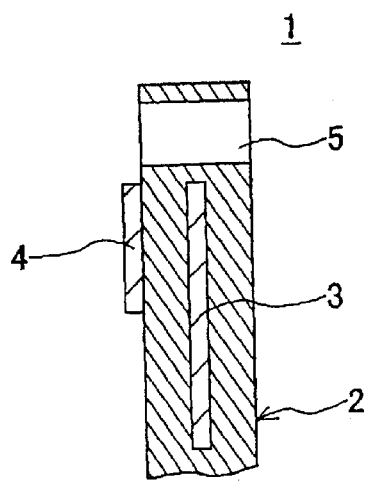
FIG. 3 is a cross sectional view taken on line B1—B1 in FIG. 1.
Figure 4:
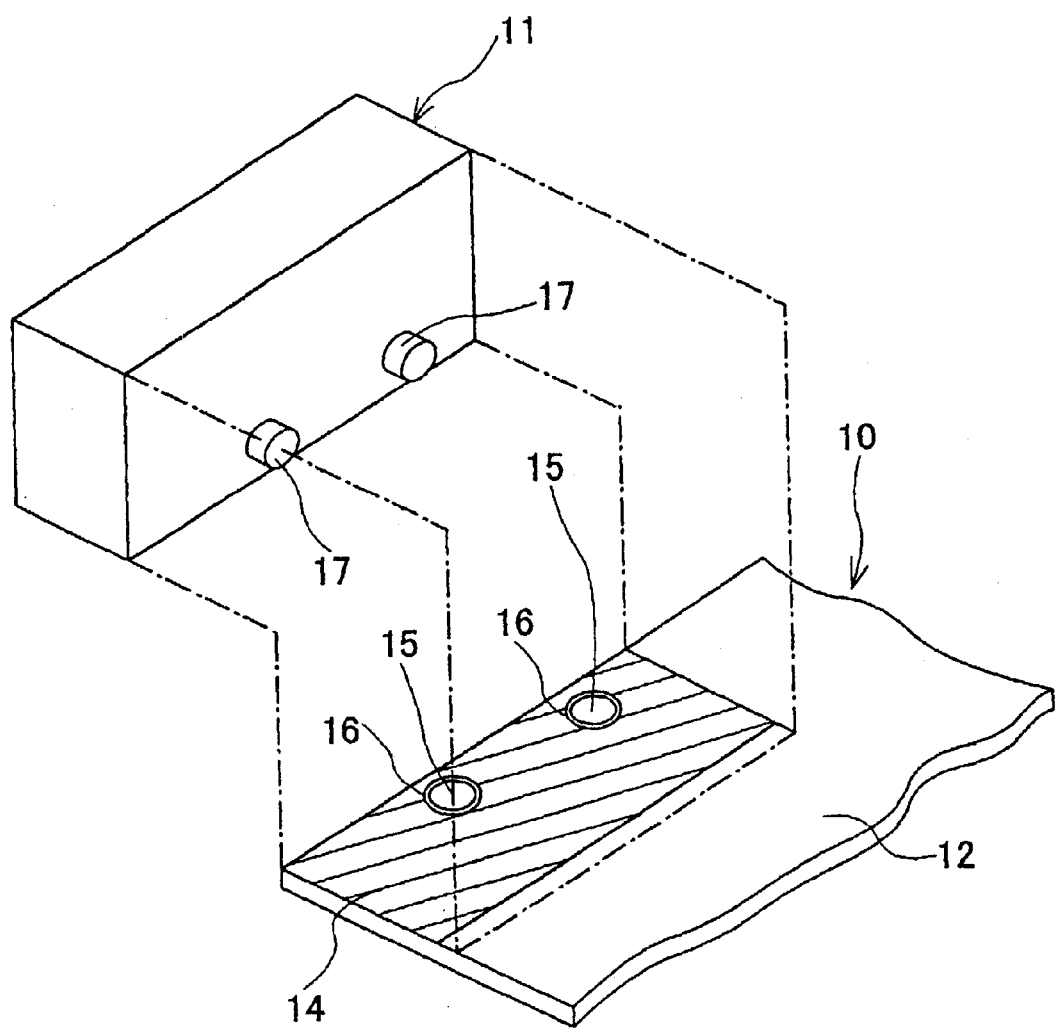
FIG. 4 is a perspective view of a multi-layer interconnection board of an embodiment of the present invention and an electronic device.
Figure 5:
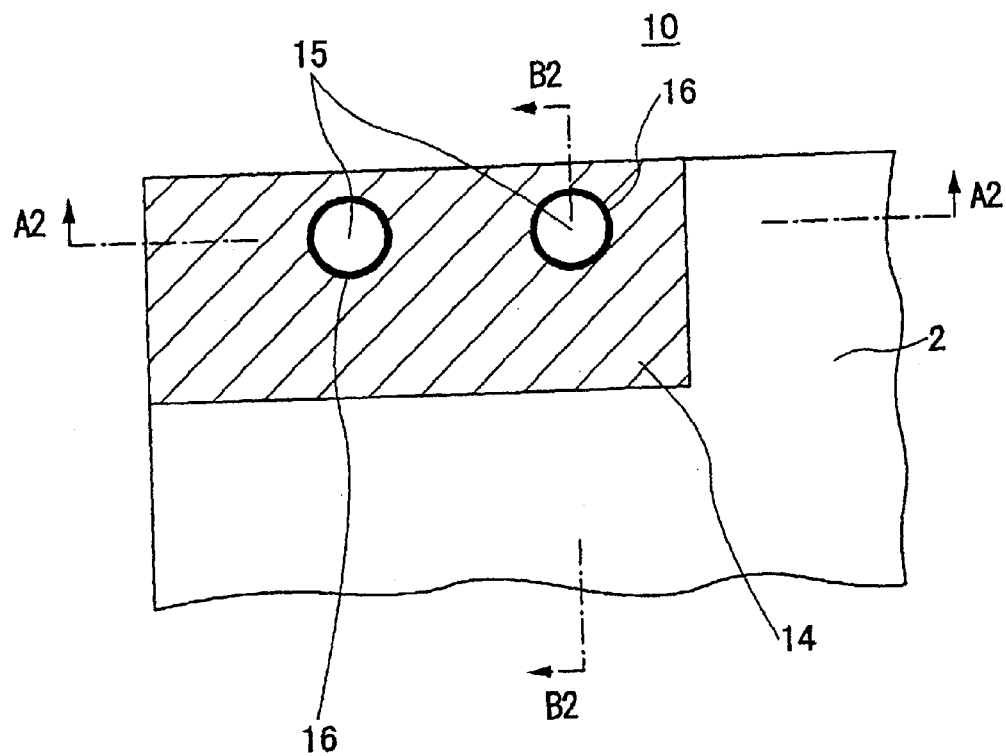
FIG. 5 is a plan view of the multi-layer interconnection board of the embodiment of the present invention.
Figure 6:
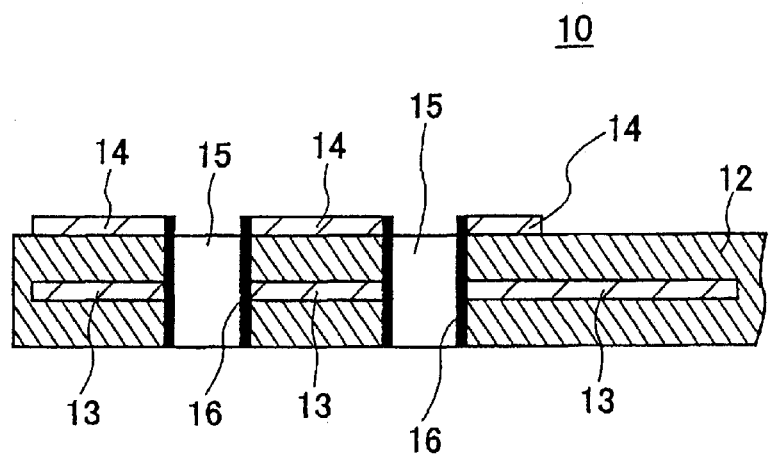
FIG. 6 is a cross sectional view taken on line A2—A2 in FIG. 5.
Figure 7:
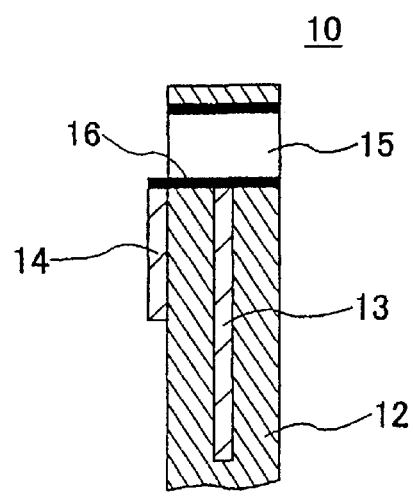
FIG. 7 is a cross sectional view taken on line B2—B2 in FIG. 5.

FIG. 4 is a perspective view of a multi-layer interconnection board 10 of an embodiment of the present invention and an electronic device 11. FIG. 5 is a plan view of the multi-layer interconnection board 10 of the embodiment of the present invention. FIG. 6 is a cross sectional view taken on line A2—A2 in FIG. 5. FIG. 7 is a cross sectional view taken on line B2—B2 in FIG. 5. For example, the multi-layer interconnection board 10 shown in FIGS. 4 through 7 is provided in a portable personal computer.

The multi-layer interconnection board 10 includes a board body part 12 made of glass-epoxy. A plural internal layer interconnection is stacked inside of the board body part 12. A surface ground layer 14 is formed on the board body part 12. Although the internal layer interconnection includes a signal layer (a signal interconnection), an electric power supply layer (an electric power supply interconnection), an internal ground layer 13, and others, only the internal ground layer 13 is shown in the respective FIGS. 6 and 7 for convenience of an explanation and an illustration of the present invention. In addition, the respective layers are formed by metal materials having high conductivities such as copper.

Furthermore, a hole part 15 is formed in the multi-layer interconnection board 10. As described above, some of various electronic devices are required to have a high accuracy of positioning on the multi-layer interconnection board 10. For instance, the electronic device 11 such as a connector or a switch is required to have a high accuracy of positioning on the multi-layer interconnection board 10.

Referring to FIG. 4, in order to package the electronic device 11 of which a high accuracy of positioning on the multi-layer interconnection board 10 is required, a convex part 17 for positioning is formed on the electronic device 11 and the hole part 15 for receiving the convex part 17 is formed in the multi-layer interconnection board 10.

The convex part 17 is formed on a case of the electronic device 11 in a body. More concretely, the convex part 17 is formed on a packaging surface, namely a bottom surface of the case to be packaged on the multi-layer interconnection board 10. Generally, the case of the electronic device 11 packaged on the multi-layer interconnection board 10 is made of resin. Hence, the convex part 17 is also made of resin of an insulator.

In addition, the hole part 15 is formed in a forming area of the surface ground layer 14. The hole part pierces the body part 12. As shown in FIGS. 6 and 7, the internal ground layer 13 formed in the body part 12 is exposed to an internal wall part of the hole part 15.

The hole part 15 has a diameter in which the convex part 17 can be inserted without any space remaining in the hole part 15, in a state where a conductive material 16 is formed on the internal wall part of the hole part 15. Accordingly, the electronic device is positioned and packed at a designated position by inserting the convex part 17 of the electronic device 11 in the hole part 15.

Meanwhile, the conductive material 16 is made of copper and formed on the internal wall part of the hole part 15 by a plating method.

Thus, the conductive material can be formed on the internal wall part of the hole part 15 easily and accurately by the plating method. In addition, a thickness of the conductive material 16, namely an electric resister value, can be set freely by controlling the plating time.

As described above, the internal ground layer 13 is formed inside of the body part 12. An end part of the internal ground layer 13 is exposed to the hole part 15. The internal wall part of the hole part 15 is covered with the conductive material 16. Accordingly, the conductive material 16 and the internal ground layer 13 are connected electrically.

In addition, the conductive material 16 is connected to the surface ground layer 14 electrically. Since the conductive material 16 is formed in the forming area of the surface ground layer 14, the conductive material 16 and the surface ground layer 14 are formed in a body in this embodiment.

Thus, it is possible to simplify the manufacturing process of the multi-layer interconnection board 10 by plating to form the surface ground layer 14 and the conductive material 16 in a body. In addition, it is possible to make a connecting position of the surface ground layer 14 and the conductive material 16 having a low resister value. In a case that the surface ground layer 14 and the conductive material 16 are not plated in a body, an interface is deteriorated so that a connecting resister between the ground layers may become high. However, in this embodiment, the connecting resister can be prevented from becoming high.

As described above, in this embodiment, it is possible to electrically connect layers in the internal ground layer 13 formed inside the board body part 12 as a single layer or as plural layers, by the conductive material 16 provided on the internal wall part of the hole part 15. Although one layer of the internal ground layer 13 is mentioned in FIG. 6, the present invention is not limited to being applied to the one layer of the internal ground layer 13.

The hole part 15 has a relatively big diameter so that the convex part 17 of the electronic device 11 can be inserted. For instance, the diameter of the hole part 15 is three times the diameter of the via hole part 6 in the related art.

Thus, the conductive material 16 is provided on the internal wall part of the hole part 15 having a large diameter. As a result, it is possible to electrically connect the respective ground layers 13 and 14 by the resister having a low resister value (low impedance).

It is well known that sufficient reduction of noise caused by a disturbance can be obtained, as the ground layers 13 and 14 have low resister values. Accordingly, it is possible to improve the effect of the noise reduction by connecting the ground layers 13 and 14 with the conductive material 16 provided on the internal wall part of the hole part 15. In addition, it is possible to reduce a possibility of an incorrect action of the PC by applying the multi-layer interconnection board 10 of the present invention to the PC. As a result, it is possible to contribute to improvement in the reliability of the PC.

Furthermore, in this embodiment, the conductive material 16 is connected to not only the internal ground layer 13 but also the surface ground layer 14. Hence, the internal ground layer 13 is connected to the surface ground layer 14 with the conductive material 16 having a low resister value. Therefore, the effect of the noise reduction can be obtained more sufficiently.

In the related art, it is necessary to provide a large number of the via hole parts 6 in order to make a low resister state where the ground layers 3 and 4 are connected by the via hole parts 6. However, if a large number of the via hole parts 6 are formed on the multi-layer interconnection board 10, the manufacturing process of the multi-layer interconnection board becomes complicated. In addition, the packaged parts, such as the electronic devices, on the multi-layer interconnection board are also limited as to being positioned by the via hole part 6.

On the other hand, the hole part 15 in which the convex part 17 is inserted is used in this embodiment to connect the ground layers. The conductive material 16 is provided on the internal wall part of the hole part 15, and thereby the ground layers 13 and 14 are connected. As a result, it is possible to improve the effect of the noise reduction without implementing a complicated manufacturing process of the board and limiting the positioning of the packaged parts such as the electronic device 11 on the multi-layer interconnection board 10.

The present invention is not limited to these embodiments, but variations and modifications may be made without departing from the scope of the present invention. For instance, the multi-layer interconnection board 10 is not limited to be applied to the PC. Rather, the multi-layer interconnection board 10 can be applied to other electronic devices and apparatuses.

In addition, the hole part 15 to which the conductive material is formed is not limited to the hole part into which the convex part 17 of the electronic device 11 is inserted.

This patent application is based on Japanese priority patent application No. 2001-283801 filed on Sep. 18, 2001, the entire contents of which are hereby incorporated by reference.

What is claimed is:

1. A multi-layer interconnection board, comprising:
 a multi-layer structure in which plural interconnections are provided and which includes a ground layer; and
 a hole part provided in the multi-layer structure,
 wherein a conductive part is provided on an internal wall part of the hole part, and
 wherein the hole part has a diameter so that a non-conductive convex part of a device which can be packaged on the multi-layer interconnection board is able to be inserted in the hole for positioning the device on the multi-layer interconnection board.

2. The multi-layer interconnection board as claimed in claim 1, wherein the conductive part is formed by a plating method.

3. The multi-layer interconnection board as claimed in claim 1, wherein the ground layer includes a surface ground layer provided on a surface part of the multi-layer interconnection board and an internal ground layer provided inside of the multi-layer interconnection board.

4. The multi-layer interconnection board as claimed in claim 1, wherein the conductive part is made of copper.

5. The multi-layer interconnection board as claimed in claim 2, wherein the ground layer includes a surface ground layer provided on a surface part of the multi-layer interconnection board and an internal ground layer provided inside of the multi-layer interconnection board.

6. The multi-layer interconnection board as claimed in claim 3, wherein the hole part is provided in a forming area of the surface ground layer.

7. The multi-layer interconnection board as claimed in claim 5, wherein the hole part is provided in a forming area of the surface ground layer.

* * * * *